United States Patent
Asari et al.

(10) Patent No.: US 7,547,209 B2
(45) Date of Patent: Jun. 16, 2009

(54) VERTICAL HEAT TREATMENT SYSTEM AND AUTOMATIC TEACHING METHOD FOR TRANSFER MECHANISM

(75) Inventors: Satoshi Asari, Tokyo-to (JP); Katsuhiko Mihara, Tokyo-to (JP); Hiroshi Kikuchi, Tokyo-to (JP)

(73) Assignee: Tokyo Electron Limited, Tokyo (JP)

( * ) Notice: Subject to any disclaimer, the term of this patent is extended or adjusted under 35 U.S.C. 154(b) by 76 days.

(21) Appl. No.: 10/593,901

(22) PCT Filed: Mar. 25, 2005

(86) PCT No.: PCT/JP2005/005529

§ 371 (c)(1),
(2), (4) Date: Apr. 18, 2007

(87) PCT Pub. No.: WO2005/093821

PCT Pub. Date: Oct. 6, 2005

(65) Prior Publication Data
US 2007/0273892 A1    Nov. 29, 2007

(30) Foreign Application Priority Data
Mar. 25, 2004    (JP)    ............................. 2004-089514

(51) Int. Cl.
F27D 3/00    (2006.01)
(52) U.S. Cl. .......................................... 432/239; 432/5
(58) Field of Classification Search ................ 432/239, 432/249, 253, 5; 414/936–941
See application file for complete search history.

(56) References Cited
U.S. PATENT DOCUMENTS
4,439,146 A * 3/1984 Sugita ....................... 432/253
(Continued)

FOREIGN PATENT DOCUMENTS
GB    2 223 470    4/1990
(Continued)

OTHER PUBLICATIONS
PCT Translation of International Preliminary Report on Patentability (PCT/JP2005/005529) (Form PCT/IPEA/409), dated Jan. 2004.
(Continued)

Primary Examiner—Gregory A Wilson
(74) Attorney, Agent, or Firm—Smith, Gambrell & Russell, LLP

(57) ABSTRACT

A transfer mechanism 21 of a vertical heat treatment system 1 includes a base capable of vertical movement and turning movement, and plural substrate support devices, disposed on the base so as to be movable anteroposterior, that hold wafers W. Provided on the base 25 is a first sensor 45 that emits a light beam directed toward a direction in which the substrate support device 20 moves anteroposterior, and detects the target member upon receipt of a reflected light of the light beam. Provided on two tip end portions of the substrate support device 20 is a second sensor 40 that detects the target member upon interruption of a light beam traveling between the tip end portions by the target member. When a target member 44 provided at its specific positions with projections 49 and 50 is placed at a position in a wafer boat 8, the base 25 moves vertically and turns, and the substrate support device 20 moves anteroposterior. The position of the target member, or the transfer target position of the wafer, is automatically detected based on the detection signals of the first sensor 45 and the second sensor obtained at the time and encoder values of drive systems relating to the movement of the base 25 and the substrate support member 20.

6 Claims, 8 Drawing Sheets

U.S. PATENT DOCUMENTS

| | | | |
|---|---|---|---|
| 5,409,348 A | | 4/1995 | Suzuki |
| 5,562,383 A | * | 10/1996 | Iwai et al. ................. 414/217.1 |
| 5,829,939 A | * | 11/1998 | Iwai et al. .................... 414/411 |
| 6,878,955 B2 | * | 4/2005 | Harris et al. ........... 250/559.33 |
| 2003/0170583 A1 | * | 9/2003 | Nakashima et al. ......... 432/241 |

FOREIGN PATENT DOCUMENTS

| | | |
|---|---|---|
| JP | 09-102527 | 4/1997 |
| JP | 11-163084 | 6/1999 |
| JP | 11-186360 | 7/1999 |
| JP | 2002-110769 | 4/2002 |
| JP | 2002-164406 | 6/2002 |
| JP | 2003-165078 | 6/2003 |
| JP | 2005-260176 | 9/2005 |
| WO | 99/02996 | 1/1999 |
| WO | 03/022534 | 3/2003 |

OTHER PUBLICATIONS

PCT Notification of Transmittal of Translation of the International Preliminary Report on Patentability (PCT/JP2005/005529) (Form PCT/IB/338), dated Jan. 2004.

Supplementary European Search Report.

* cited by examiner

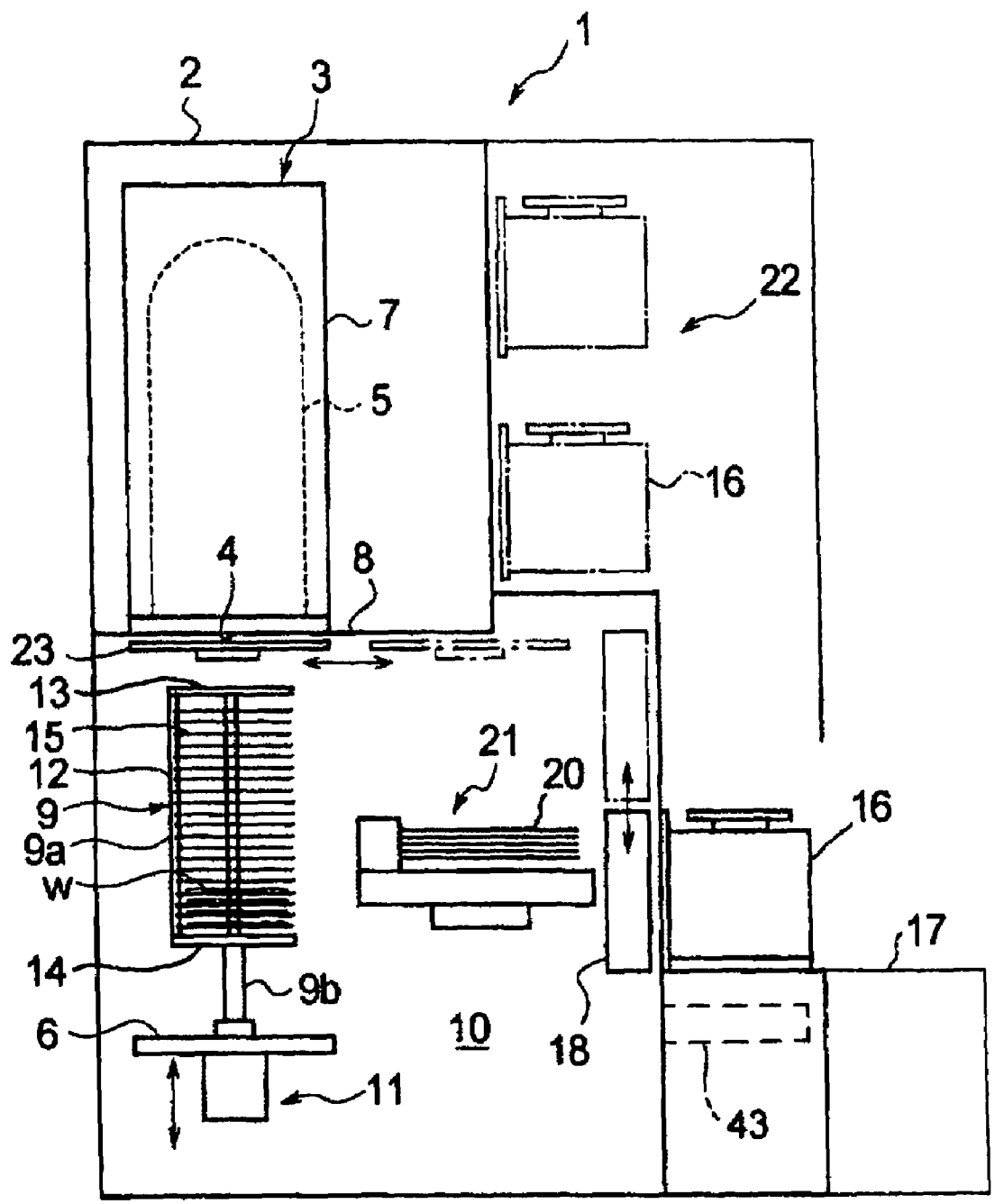
F I G. 1

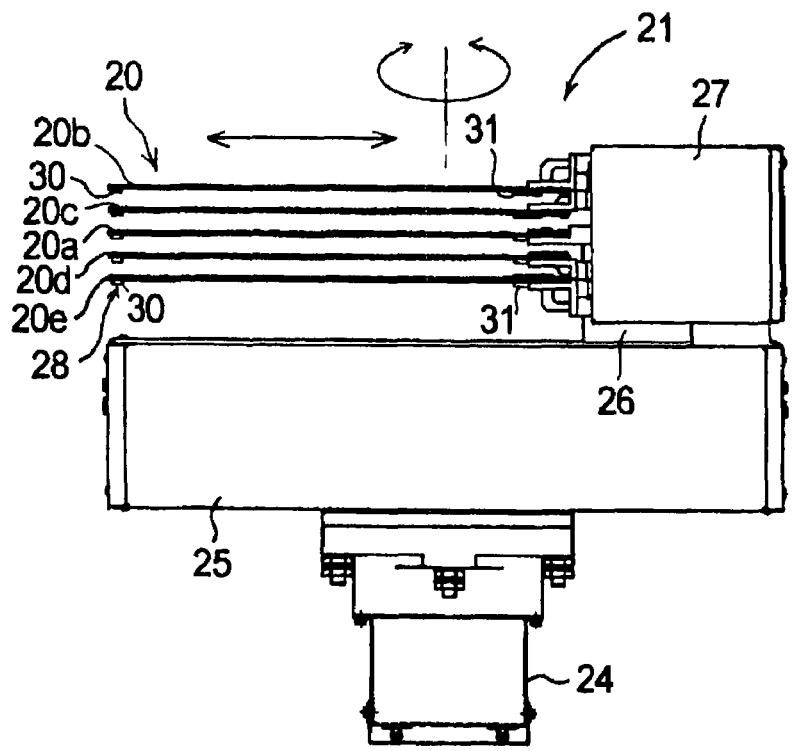
F I G. 2
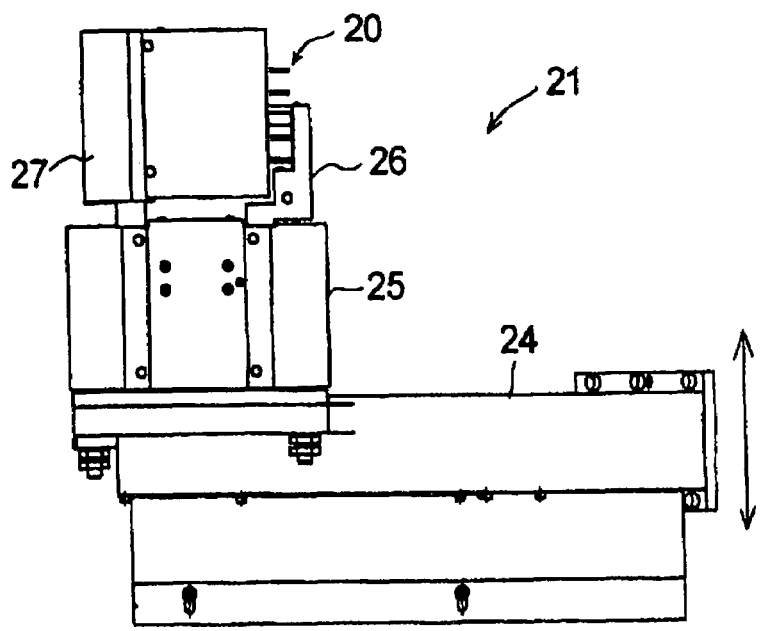
F I G. 3

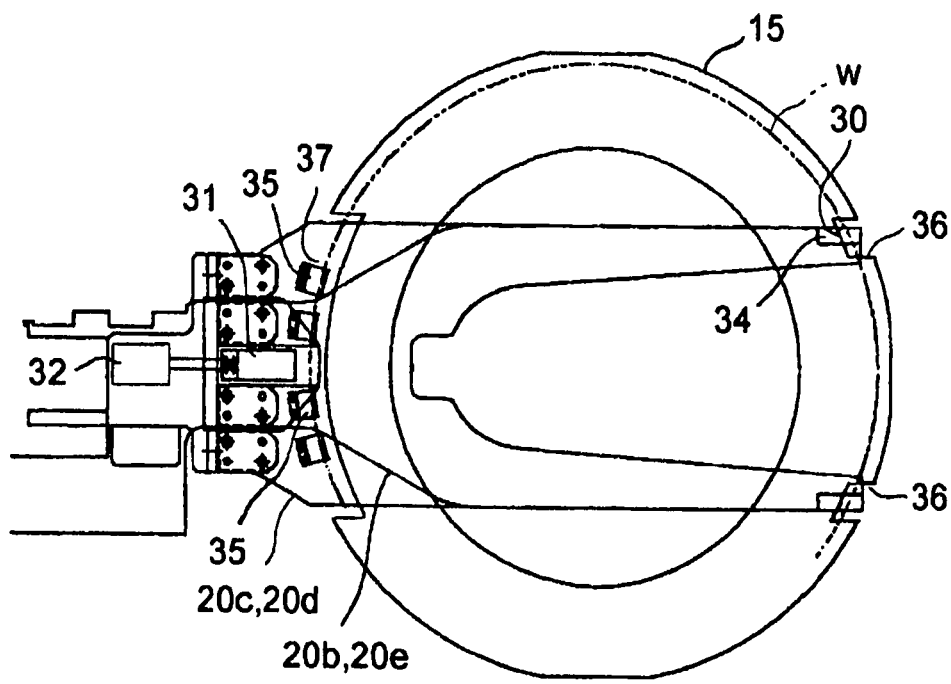
F I G. 4
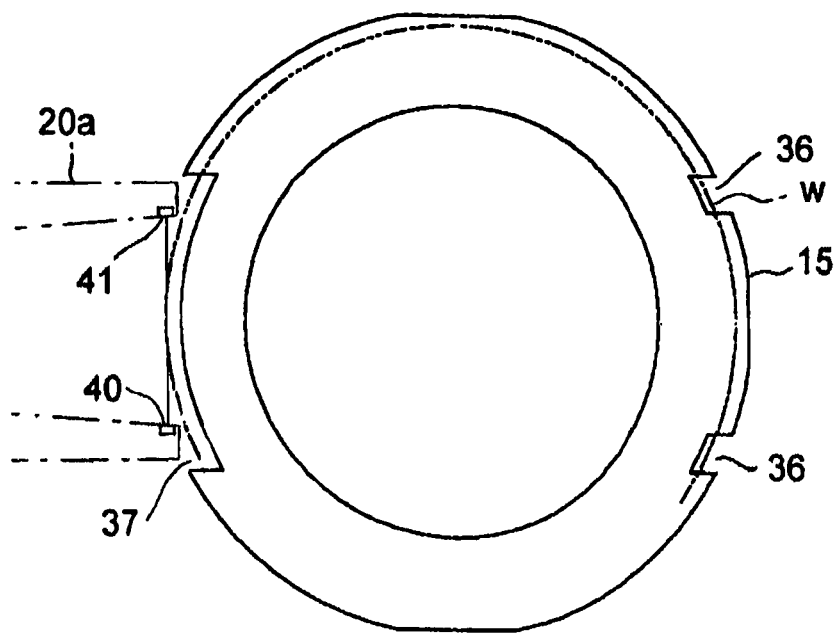
F I G. 5

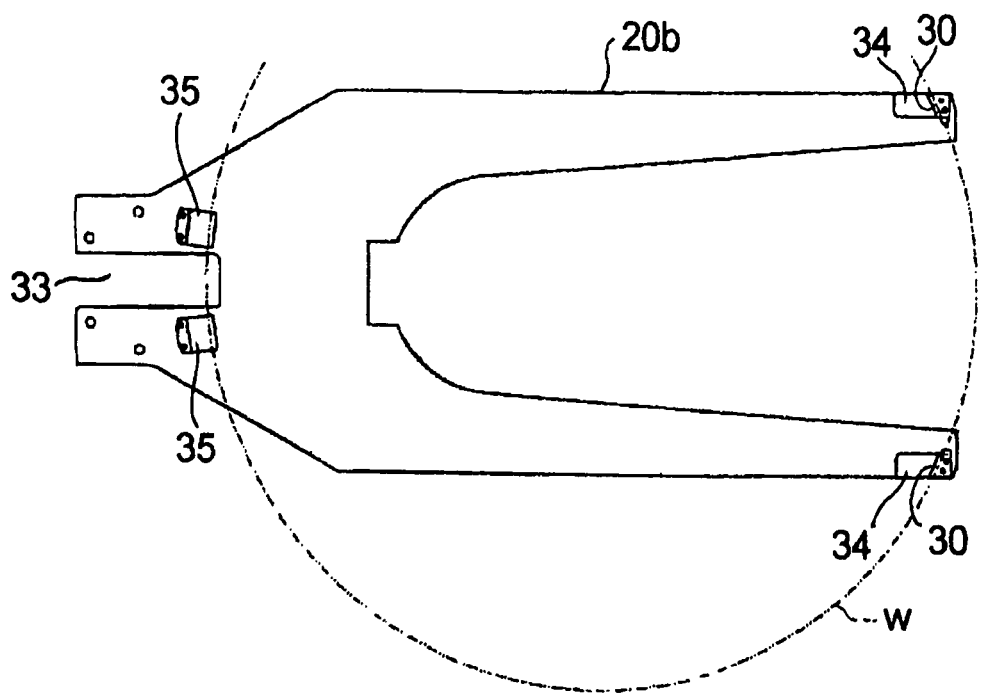
F I G. 6
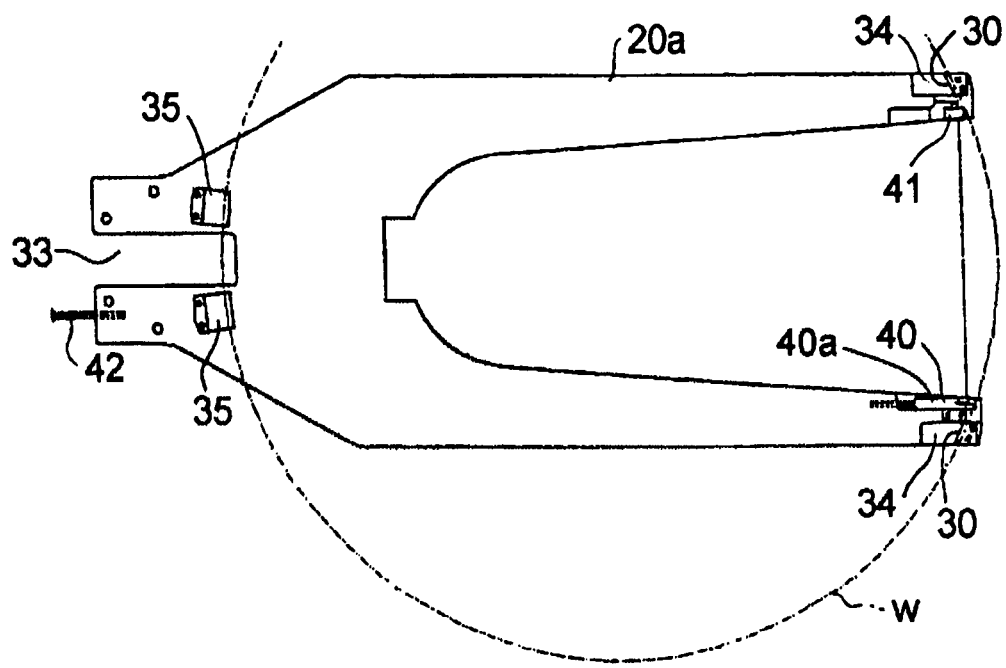
F I G. 7

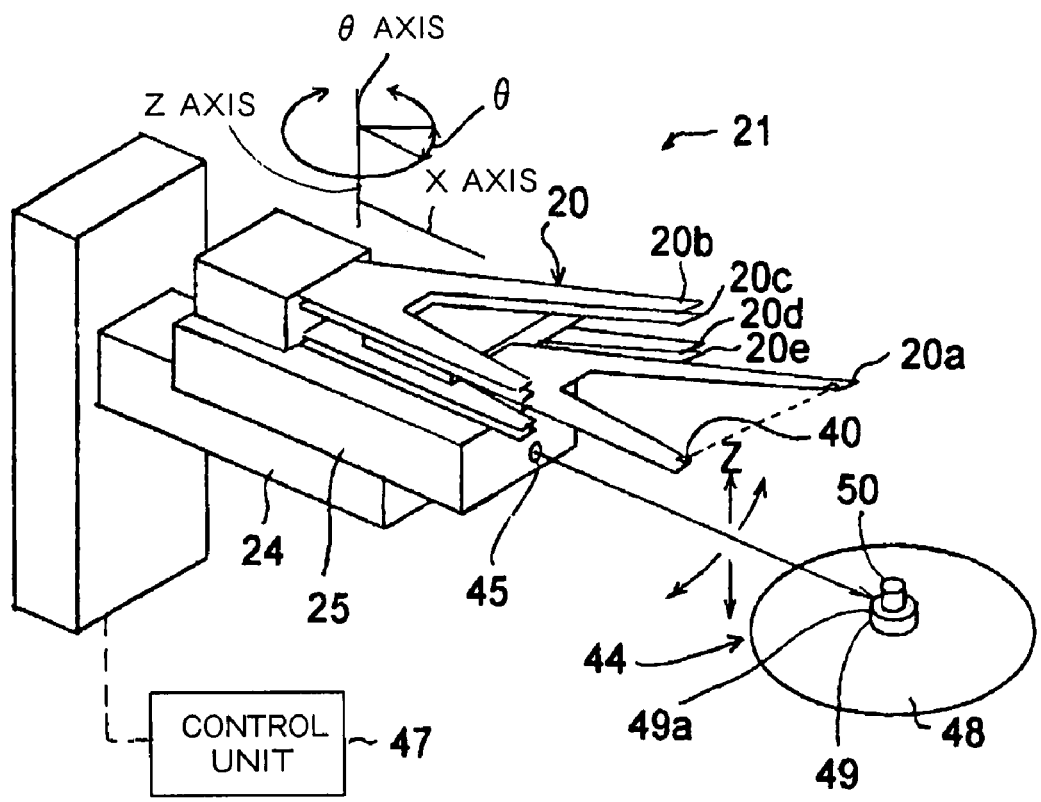
F I G. 11
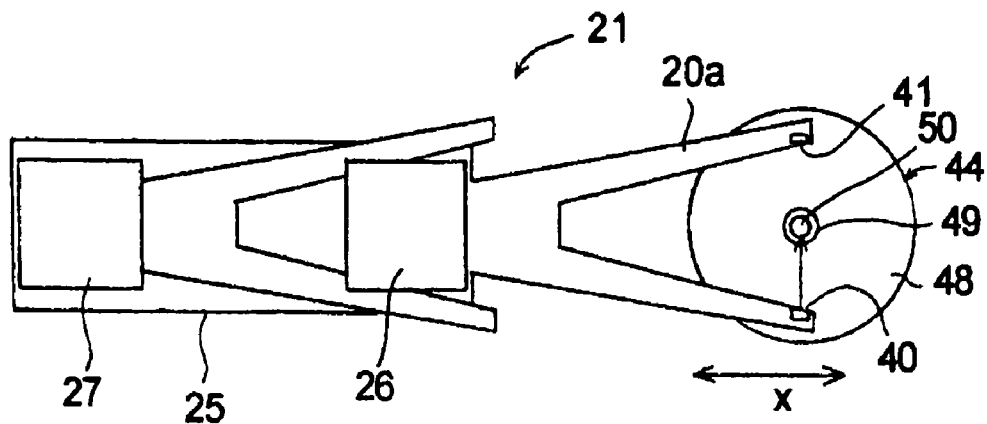
F I G. 12

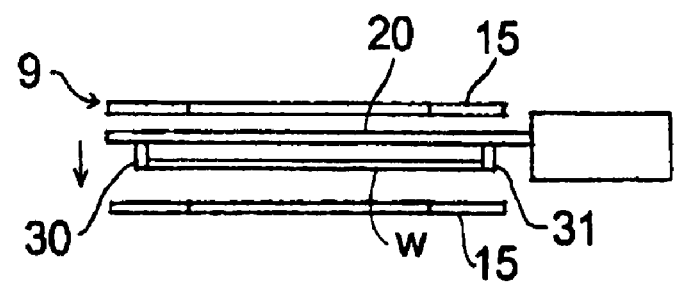
F I G. 14A
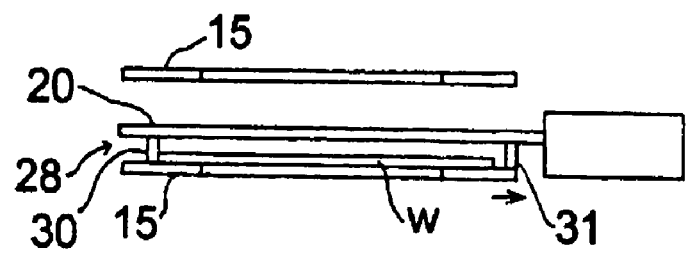
F I G. 14B
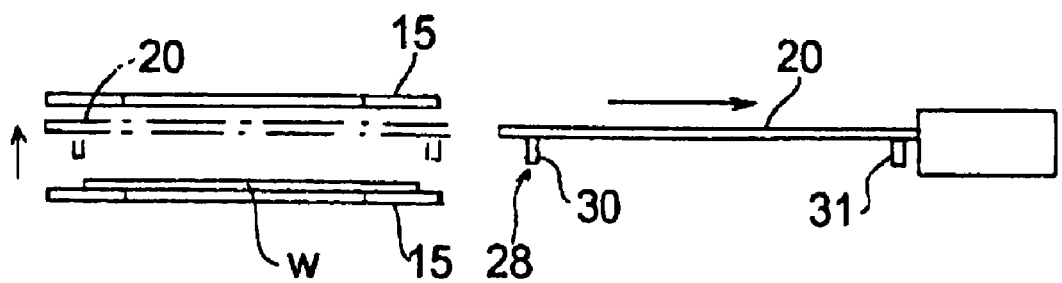
F I G. 14C

VERTICAL HEAT TREATMENT SYSTEM AND AUTOMATIC TEACHING METHOD FOR TRANSFER MECHANISM

TECHNICAL FIELD

The present invention relates to a vertical heat treatment system and an automatic teaching method for a transfer mechanism, and more particularly to a technique of automatic teaching by which the transfer mechanism for transferring process objects automatically finds the operation target point by itself.

BACKGROUND ART

A manufacturing process of a semiconductor device includes various process steps that perform various heat treatments, such as an oxidation treatment, a diffusion treatment, a CVD treatment, and an annealing treatment, to process objects, e.g., semiconductor wafers. A vertical heat treatment system capable of heat-treating plural wafers at one time has been used as one of heat treatment systems for performing the foregoing process steps.

The vertical heat treatment system includes: a heat treatment furnace; a holder (also referred to as "wafer boat") that is loaded and unloaded into and from the heat treatment furnace while the holder holds plural wafers at vertical intervals; and a transfer mechanism that transfers wafers between the holder and a container (also referred to as "carrier" or "cassette") for holding therein plural wafers at predetermined intervals. The transfer mechanism includes: a base capable of vertical movement and rotation; and plural substrate support devices mounted to the base and being capable of anteroposterior movement, and of holding wafers, respectively (See JP2002-164406A, for example).

The transfer mechanism comprises a robot that automatically performs predetermined transfer work in accordance with a control program stored in the controller of the robot. In order to enable such a transfer mechanism to transfer wafers to their appropriate positions within the holder or the container, the operator performs teaching of wafer transfer target points while the operator manually (i.e., non-automatically) operates the transfer mechanism in a remote-control mode.

The teaching accuracy depends on the skill of the operator. Thus, the teaching work is sometimes time-consuming, or teaching of target points with sufficient accuracy is sometimes impossible. In addition, a dummy wafer, which is placed at a predetermined place within the holder, is not transferred in every process but is continuously placed at the predetermined place for a long time. Thus, the dummy wafer is likely to be displaced due to vibration or the like. Under the circumstances, the position of the dummy wafer is regularly corrected so that the dummy wafer is returned to its right position. It is difficult to perform the correction rapidly and accurately by means of a conventional transfer mechanism. If a wafer is not held at an appropriate position within the holder, for example, if the wafer sticks out of the holder, an accident such as fall or damage of the wafer may possibly occur.

DISCLOSURE OF THE INVENTION

The present invention has been made in view of the foregoing circumstances. The object of the present invention is to provide: a vertical heat treatment system having a transfer mechanism with an automatic teaching system capable of automatically perform teaching of a target position to eliminate variation in teaching accuracy due to human error; and an automatic teaching method for a transfer mechanism.

Another object of the present invention is to enable that periodical position correction of a dummy wafer can be performed rapidly and accurately.

Another object of the present invention is to enable that the condition of the wafers held in a holder unloaded from a heat treatment furnace can be monitored before or after a heat treatment, thereby to prevent an accident such as damage of a wafer.

The present invention provides a vertical heat treatment system, which includes: a heat treatment furnace; a holder that is loaded and unloaded into and from the heat treatment furnace while the holder holds a plurality of process objects which are arranged at multiple level and spaced at vertical intervals; a transfer mechanism that transfers process objects between the holder and a container adapted to hold a plurality of process objects at predetermined intervals, the transfer mechanism including a base adapted for vertical movement and turning movement, and a plurality of substrate holding devices, each adapted to support a process object, mounted to the base so as to be movable anteroposteriorly; a target member to be placed at a target position, in the holder or the container, to which a process object is to be transferred; a first sensor, attached to the base, that emits a light beam directed toward a direction in which the substrate support device moves, and detects the target member upon receipt of a reflected light of the light beam; a second sensor, attached to two tip end portions of the substrate support device, that detects the target member upon interruption of a light beam traveling between the tip end portions by the target member; and a control unit that deduces the target position based on detection signals of the first and second sensors and encoder values of drive systems of the transfer mechanism associated with the detection signals, and recognizes the target position thus deduced.

In one preferable embodiment, the target member includes: a substrate part having an dimension substantially identical with that of the process object; a first detection target part provided on a center portion of the substrate part to project therefrom, and having a circumference provided thereon with a reflective surface for reflecting the light beam emitted by the first sensor; and one or two second detection target parts to be detected by the second sensor, wherein the second detection target is provided on the upper portion of the first detection target part if the second detection target numbers one, and the second detection target parts are provided on the substrate part and arranged symmetrically with respect to the first detection target part with the first detection target part being disposed between the second detection target parts if the second detection target numbers two.

In one preferable embodiment, the control unit is configured to perform, when the control unit deduces and recognizes the target position, the steps including: a first step that moves the base vertically to detect a position where the detection signal of the first sensor is reversed, and deduces a center of the target member with respect to a vertical direction based on an encoder value of the drive system relating to the vertical movement of the base obtained at the position where the detection signal of the first sensor is reversed; a second step that turns the base about an vertical axis to detect a position where the detection signal of the first sensor is reversed, and deduces a center of the target member with respect to a turning direction based on an encoder value of the drive system relating to the turning movement of the base obtained at the position where the detection signal of the first sensor is reversed; and a third step that moves the substrate support device to detect a position where the detection signal of the second sensor is reversed, and deduces a center of the target member with respect to an anteroposterior direction based on an encoder value of the drive system relating to an anteroposterior movement of the substrate support device obtained at the position where the detection signal of the second sensor is reversed.

Preferably, the substrate support devices are provided with gripping mechanisms adapted to hold process objects by gripping them from their front and rear ends. This configuration allows periodical positional correction of dummy wafers to be performed rapidly and precisely.

Preferably, the second sensor is arranged and adapted to detect conditions of process objects held in the holder at multiple levels by scanning the process objects along a vertical direction in which the process objects are arrayed. This configuration allows conditions of the process objects to be monitored before or after the heat treatment.

The present invention further provides a method of teaching a transfer mechanism of a vertical heat treatment system, which includes: a heat treatment furnace; a holder that is loaded and unloaded into and from the heat treatment furnace while the holder holds a plurality of process objects which are arranged at multiple level and spaced at vertical intervals; the transfer mechanism that transfers process objects between the holder and a container adapted to hold a plurality of process objects at predetermined intervals, the transfer mechanism including a base adapted for vertical movement and turning movement, and a plurality of substrate holding devices, each adapted to support a process object, mounted to the base so as to be movable anteroposteriorly, said method comprising the steps of: placing a target member at a target position, in the holder or the container, to which a process object is to be transferred; providing, on the base, a first sensor that emits a light beam directed toward a direction in which the substrate support device moves, and detects the target member upon receipt of a reflected light of the light beam, and providing a second sensor, on two tip end portions of the substrate support device, that detects the target member upon interruption of a light beam traveling between the tip end portions by the target member; recognizing the target position by performing: a first step that moves the base vertically to detect a position where the detection signal of the first sensor is reversed, and deduces a center of the target member with respect to a vertical direction based on an encoder value of the drive system relating to the vertical movement of the base obtained at the position where the detection signal of the first sensor is reversed; a second step that turns the base about an vertical axis to detect a position where the detection signal of the first sensor is reversed, and deduces a center of the target member with respect to a turning direction based on an encoder value of the drive system relating to the turning movement of the base obtained at the position where the detection signal of the first sensor is reversed; and a third step that moves the substrate support device to detect a position where the detection signal of the second sensor is reversed, and deduces a center of the target member with respect to an anteroposterior direction based on an encoder value of the drive system relating to an anteroposterior movement of the substrate support device obtained at the position where the detection signal of the second sensor is reversed.

BRIEF DESCRIPTION OF THE DRAWINGS

FIG. 1 is a longitudinal cross-sectional view schematically showing a vertical heat treatment system in one embodiment of the present invention;

FIG. 2 is a side view of a transfer mechanism;

FIG. 3 is a side view of the transfer mechanism of FIG. 2 viewed from another side;

FIG. 4 is a plan view of a substrate support device and related parts of the transfer mechanism;

FIG. 5 is a plan view of a ring-shaped support plate;

FIG. 6 is a plan view of the substrate support device viewed from below;

FIG. 7 is a plan view of another substrate support device viewed from below;

FIG. 11 is a perspective view for explanation of deducing of a position with respect to a turning direction and a vertical direction of a target point when teaching operation is performed;

FIG. 12 is a plan view for explanation of deducing of a position with respect to an anteroposterior direction;

FIG. 14(a), FIG. 14(b) and FIG. 14(c) schematically show the steps of the transfer operation of the transfer mechanism.

DESCRIPTION OF REFERENCE SIGNS

Figure 8:
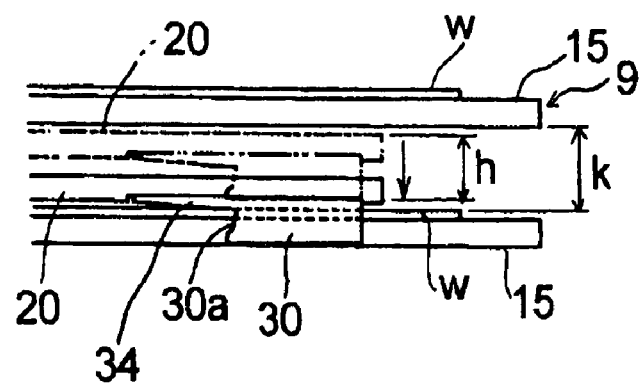
FIG. 8 is a schematic side view of a fixed engagement member and a seat arranged on the distal end portions of the substrate support device.

1 . . . Vertical heat treatment system
3 . . . Heat treatment furnace
9 . . . Holder
20 . . . Substrate support device
21 . . . Transfer mechanism
25 . . . Base of transfer mechanism
28 . . . Gripping mechanism of transfer mechanism
44 . . . Target member
45 . . . First sensor
46 . . . Second sensor
47 . . . Control unit
48a . . . Substrate part of target member
49a . . . Reflecting surface of target member
49 . . . First detection target part of target member
50 . . . Second detection target of target member

BEST MODE FOR CARRYING OUT THE INVENTION

The best mode for carrying out the invention will be described in detail with reference to the accompanying drawings. FIG. 1 is a longitudinal cross-sectional view schematically showing a vertical heat treatment system in one embodiment of the present invention. FIG. 2 is a side view of a transfer mechanism. FIG. 3 is a side view of the transfer mechanism of FIG. 2 viewed from another side. FIG. 4 is a plan view of a substrate support device and related parts of the transfer mechanism.

As shown in FIG. 1, a vertical heat treatment system 1 includes an enclosure 2 serving as a frame of the system. A vertical heat treatment furnace 3 is provided in the enclosure 2 at an upper part thereof. The heat treatment furnace 3 accommodates process objects (also referred to as "substrates to be processed") such as semiconductor wafers W each having a shape of a thin circular disk, and performs a predetermined treatment, e.g., a CVD treatment. The heat treatment furnace 3 mainly composed of: a vertically-elongated, processing vessel (in the illustrated embodiment, a reaction tube formed of quartz) having a lower end opening serving as a furnace throat 4; a vertically-movable lid 6 for opening and closing the furnace throat 4 of the reaction tube 5; and a heater (heating mechanism) 7 surrounding the reaction tube 5 to heat the same at a predetermined controlled temperature, e.g., 300° C. to 1200° C.

A base plate 8 formed of a stainless steel is horizontally disposed in the enclosure 2 to support the reaction tube 5 and the heater 7 constituting the heat treatment furnace 3. The base plate 8 has an opening (not shown) through which the reaction tube 5 is inserted.

The reaction tube 5 is inserted upward into the opening formed in the base plate. 8 from below, and an outwardly-extending flange part formed in a lower end part of the reaction tube 5 is secured to the base plate 8 by means of flange holding members, whereby the reaction tube 5 is mounted to the base plate 8. It is possible to detach the reaction tube 5 from the base plate 8 for a cleaning operation or the like. Plural gas inlet pipes (not shown) are connected to the reaction tube 5 to supply process gases and an inert gas for purging operation into the reaction tube 5. An exhaust pipe, which is provided thereon with a vacuum pump and a pressure control valve capable of evacuating the reaction tube to a controlled reduced pressure (both not shown), is also connected to the reaction tube 5.

A work area (loading area) 10 is provided below the base plate 8 in the enclosure 2. In the work area 10, the holder (i.e., boat) 9 mounted to the lid 6 is loaded and unloaded into and from the heat treatment furnace 3 (i.e., the reaction tube 5), and wafers W are transferred to the holder 9. An elevating mechanism 11 is provided in the work area 10 to vertically move the lid 6 so as to load and unload the boat 9 into and from the heat treatment furnace 3. The lid 6 comes into contact with the open end part of the furnace throat 4 to hermetically close the same. A rotating mechanism (not shown) is disposed on a lower side of the lid 6.

The holder 9 includes a main body 9a for supporting plural wafers W at multiple levels, and a leg 9b for supporting the main body 9a. The leg 9b is connected to a rotating shaft of the rotating mechanism. The holder 9 as illustrated is formed of quartz, and is capable of holding plural, e.g., about 75, wafers W each having a large diameter, e.g., 300 mm, via ring-shaped support plate 15. In the holder 9, the wafers are held in a horizontal posture while being spaced at predetermined vertical intervals, e.g., an arrangement pitch of 11 mm. A lower heating mechanism (not shown) is provided between the main body 9a and the lid 6 to prevent lowering of the temperature in the reaction tube 5 which may be caused by heat dissipation through the furnace throat 4. The holder 9 need not have the leg 9b. In this case, the main body 9a is mounted on the lid 6 through a heat-insulating tube. The holder 9 includes: plural struts 12; a top plate 13 connected to the upper ends of the struts 12; a bottom plate 14 connected to the lower ends of the struts 12; and the ring-shaped support plates 15 arranged on the struts 12. The ring-shaped support plates 15 are arranged at multiple levels while they are engaged with recesses or projections which are formed in the struts 12 and spaced at predetermined intervals. Each of the ring-shaped support plates 15 is formed of, e.g., quartz or ceramics, has a thickness of about 2 mm to 3 mm, and has a diameter slightly larger than the outer diameter of the wafer W.

A table (also referred to as "loading port") 17 is provided at a front end portion of the enclosure 2. A container (also referred to as "carrier" or "cassette") 16 holding therein plural, e.g., about 25, wafers W at predetermined intervals is placed on the table 17; the wafers W are transferred from the container 16 into the enclosure 2, and vise versa. The container 16 is an airtight container provided with a detachable cover (not shown) at the frond side thereof. A door mechanism 18 is provided in the front end of the work area 10 to remove the cover of the container 16 so that the interior of the container is communicated with the work area 10. Provided in the work area 10 is a transfer mechanism 21, which has plural substrate support devices 20 spaced at predetermined intervals, and transfers the wafers W between the container 16 and the holder 9.

In a front upper part outside the work area 10 in the enclosure 2, there are provided a storage shelf 22 for storing thereon containers 16, and a transfer mechanism (not shown) for transferring a container 16 from the table 17 to the storage shelf 22, and vice versa. A shutter mechanism 23 is disposed in an upper part of the work area 10 to cover or close the furnace throat 4, in order to suppress or prevent releasing of heat from the high-temperature furnace to the below working area 10 through the furnace throat 4 when the lid 6 is opened. An aligner 43 is disposed below the table 17 to orient cutouts (e.g., notches), which are formed in the outer periphery of respective wafers transferred by the transfer mechanism, in the same directions.

The transfer mechanism 21 is includes plural, e.g., five, substrate support devices (also referred to as "forks" or "support plates") 20 (20a to 20e) that support plural, e.g., five, wafers W at predetermined vertical intervals. The middle substrate support device 20a can move independently from the other substrate support devices in the anteroposterior (front-and-rear) directions. The substrate support devices (first, second, forth, and fifth substrate support devices from above) 20b, 20c, 20d, and 20e other than the middle substrate support device 20a can be moved vertically in a stepless manner (continuously) relative to the middle substrate support device 20a, by means of a pitch changing mechanism (not shown). That is, the vertical intervals (i.e., arrangement pitch) of the five substrate support devices 20a to 20e can be changed in a stepless manner, relative to the middle substrate support device 20a as a reference. Therefore, even if the intervals at which the wafers W are held in the container 16 are different from those at which the wafers W are to be held in the holder 9, it is possible to transfer plural wafers collectively W between the container 16 and the holder 9.

The transfer mechanism 21 has a base 25 which is capable of vertical movement and rotation. The transfer mechanism 21 has an elevating arm 24, to which the base 25 of a box shape is attached such that the base 25 can be rotated in a horizontal plane. Arranged on the base 25 are a first moving member 26 and a second moving member 27 each of which is capable of moving in the longitudinal direction of the base 25. The substrate support device 20a, or the middle one, can be moved forward by means of the first moving member 26. Four substrate support devices 20b to 20e, which are arranged above and below the middle substrate support device 20a two by two, can be moved forward by means of the second moving member 27. This arrangement achieves a single-wafer transfer mode in which only the first moving member 26 moves to transfer a single wafer W, and a collective transfer mode in which both the first and second moving members 26 and 27 move together to transfer plural (in this case, five) wafers collectively. The base 25 provided therein with a not-shown moving mechanism for operating the first and the second moving mechanism 26 and 27. The moving mechanism and the pitch changing mechanism used herein may be those disclosed in JP2001-44260A, for example.

A coordinate system including a vertical axis (z-axis), a rotation axis (θ) axis and an anteroposterior (front-and-rear) axis (x-axis) is assigned to the transfer mechanism 21. The transfer mechanism 21 includes: a drive system that moves the base 25 in the vertical-axis direction; a drive system that rotates the base 25 about the rotation axis; a drive system that moves the substrate support devices 20 in the anteroposterior-axis direction; and encoders that detect the rotation angles of the drive devices included in the drive systems, respectively. Values detected by the encoder, or encoder values (ENC values), are utilized in the automatic teaching system in which the transfer mechanism (transfer robot) 21 itself automatically deduce the operation target point, which will be described later.

As shown in FIGS. 11 and 12, the vertical heat treatment system 1 includes as constitute member of automatic teaching system of the transfer mechanism 21: a target member 44; a first sensor 45; a second sensor 40; and a control unit 47. The target member 44 is to be placed at a predetermined target position at which a wafer W is placed within the holder 9 or the container 16. The first sensor 45 is disposed on one end of the base 25. The first sensor 45 is constituted as a laser sensor (i.e., a laser displacement meter), which emits a light beam such as a laser beam along the longitudinal direction and detects the target member 44 upon receiving a light beam reflected by the target member. 44. The second sensor 40 is disposed on both the end portions of medium substrate support device 20a. The second sensor 40 is constituted as a mapping sensor, which comprises an optoelectronic switch for example, and which detects the target member 44 upon interruption of a light beam traveling between the end portions by the target member 44. The control unit 47 has a function of deducing and recognizing the target position based on the detection signals of the first sensor 45 and the second sensor 40 and encoder values of the drive devices of the transfer mechanism 21.

Figure 9:
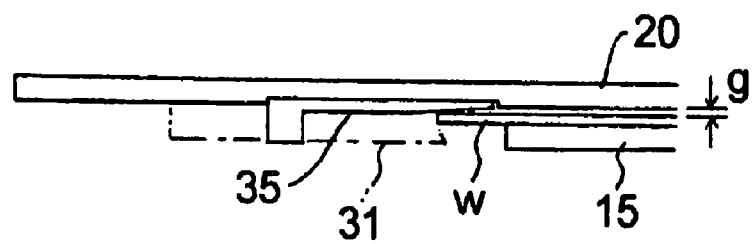
FIG. 9 is a schematic side view of a movable engagement member and a seat arranged on the proximal end portion of the substrate support device.
Figure 10:
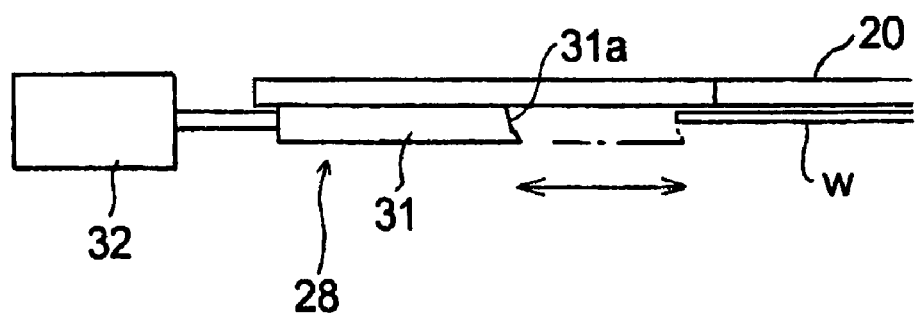
FIG. 10 is a schematic side view of the movable engagement member and a driving unit arranged on the proximal end portion of the substrate support device.

Each of the substrate support devices 20 is formed of a thin plate of alumina ceramics, and preferably, is formed in a substantially U-shape (see FIGS. 4, 6, and 7) whose distal side portion is bifurcated. The transfer mechanism 21 is provided with gripping mechanisms 28 each capable of holding a wafer W from its front and rear sides on the under side of the corresponding substrate support device. As shown in FIGS. 8 to 10, the gripping mechanism 28 includes: a fixed engagement members 30 disposed on the distal end portions of the substrate support device 20 to be engaged with the front edge of the wafer W; a movable engagement member 31 disposed on the proximal end portion of the substrate support device 20 to be disengageably engaged with the rear edge of the wafer W; and a driving mechanism such as an air cylinder actuator 32 for driving the movable engagement member 31.

When the movable engagement member 31 is moved forward by the air cylinder 32, the wafer W is held (gripped) between the movable engagement member 31 and the fixed engagement members 30. When the movable engagement member 31 is moved rearward, the wafer W is released. It is preferable that the substrate support device 20 has at its proximal end portion a cutout 33 for preventing collision with the movable engagement member 31.

Preferably, the fixed engagement member 30 and the movable engagement member 31 are respectively provided with inclined surfaces 30a and 31a for supporting thereon the front and rear peripheral edges of the wafer W, such that the wafer W is not disengaged from the engagement members 30 and 31 due to the wafer's own weight. Each of the substrate support device 20 preferably has seats 34 and 35 serving as spacers for receiving the front and rear peripheral portions of the wafer W, such that a gap (g) is formed between the lower surface of the substrate support device 20 and the upper surface of the wafer W supported by the substrate support device 20. In the illustrated embodiment, a pair of right and left seats 34 are disposed on the right and left distal end portions of the substrate support device 20, respectively; while a pair of right and left seats 35 are disposed on the right and left proximal end portions of the substrate support device 20, respectively. The seat 34 and the fixed engagement member 30 on the distal end portions are integrally formed (as a single piece) to achieve the compactness thereof. The fixed engagement members 30, the movable engagement member 31, and the seats 34 and 35 are preferably formed of a heat resistant resin such as PEEK (polyetheretherketone), in terms of improvement in their durability and of preventing them from serving as contaminant sources.

If the outer diameter of the ring-shaped support plate 15 is larger than that of the wafer W, the ring-shaped support plate 15 preferably has cutouts 36 and 37 as shown in FIGS. 4 and 5, in order to prevent the ring-shaped support plate 15 from colliding with the fixed engagement members 30, the movable engagement member 31, and, depending on the circumstances, the seats 35 on the proximal end. On the other hand, if the outer diameter of the ring-shaped support plate 15 is smaller than that of the wafer W, it is not always necessary to form the cutouts 36 and 37 in the ring-shaped support plate 15.

In order to allow the substrate support device 20 to be inserted into a space between vertically adjacent two ring-shaped support plates 15, the distance (h) between the upper surface of the substrate support device 20 and the lower surface of the fixed engagement member 30 is preferably smaller than the distance (k) (which is about 7.7 mm) between the lower surface of the upper ring-shaped support plate 15 and the upper surface of the wafer W placed on the lower ring-shaped support plate 15, and the distance (h) may be about 5.95 mm, for example. The substrate support device 20a used for a single-wafer transfer operation has at its distal end portions a mapping sensor 40 for mapping wafers W held by the holder 9.

In the illustrated embodiment, a sensor head 40a of the second sensor 40, which is capable of emitting and receiving an infrared light, is disposed on one of the distal ends of the substrate support device 20; and a mirror 41, by which the infrared light emitted from the sensor head 40a of the second sensor 40 is reflected to fall on the sensor head 40a of the second sensor 40, is disposed on the other distal end of the substrate support device 20. When the automatic teaching is performed, if the transfer mechanism is moved such that the infrared light is interrupted by the target member 44 (i.e., a detection target), the position of the target member is detected based on the encoder value at the time. In the illustrated embodiment, the second sensor 40 is provided with a detecting mechanism (not shown). A light-emitting element and a light-receiving element disposed in the detecting mechanism are connected to the sensor head 40a through optic fibers 42. As shown in FIG. 5, the transfer mechanism 21 moves the second sensor 40 so that it scans the wafers W, held by the holder 9 at multiple levels, along the direction in which the wafers W are arranged (i.e., the direction perpendicular to the paper of FIG. 5), so as to detect the presence or absence of a wafer at each level (i.e., on each ring-shaped support plate 15) in the holder 9, thereby to record (map) the detection result associated with positional data, and so as to detect the condition of wafers W held by the holder 9, for example, whether or not a wafer sticks out of the holder (displacement in x-axis direction).

Figure 13A:
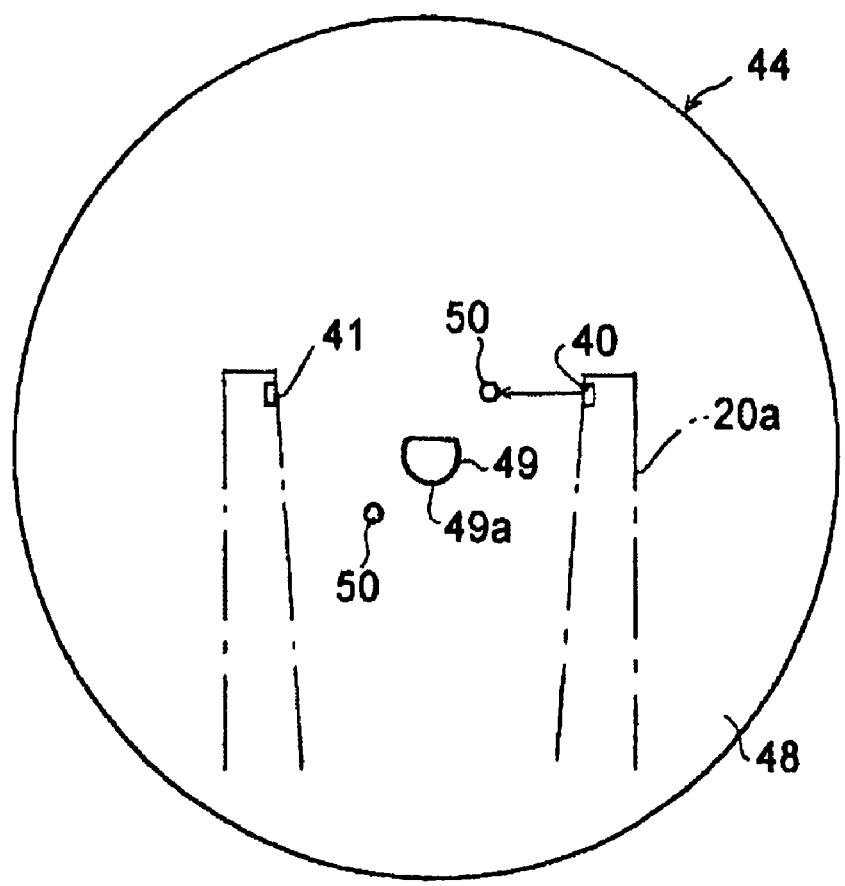
FIG. 13 shows another embodiment of the target member, wherein (a) is a plan view, and (b) is a front view.
Figure 13B:
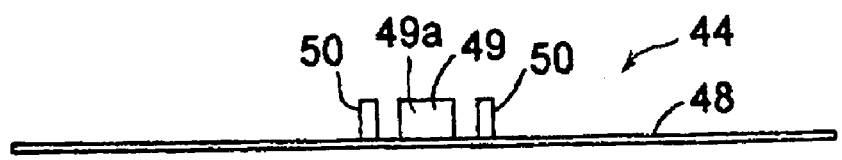

Next, the target member 44 to be utilized in the automatic teaching operation will be described. As shown in FIG. 11, the target member includes: a substrate part 48 having essentially the same dimension of a wafer A; a first detection target part 49 projected upward from the center portion of the substrate part 48; and a second detection target part 50 projected upward from the first detection target part 49. The first detection target part 49 provided on its circumference thereof with a reflecting surface 49a to reflect a light beam such as a laser beam emitted from the first sensor 45. The second detection target part 50 is formed in a small shaft (or pin) shape, and is to be detected by the second sensor 40. In place of disposing a single second detection target part 50 on the first detection target part 49, two second detection target parts 50 may be arranged on the substrate part 48 at positions symmetrical with respect to the first detection target part 49 such that the first detection target part 49 is located between the two second detection target parts 50 (See FIG. 13). In this case, the x-coordinate of the midpoint of the two second detection target parts 50 can be determined based on the encoder values at the times when the two second detection target parts 50 are detected by the second sensor, respectively. The target member of FIG. 13 may be configured so that it has a height smaller than that of the target member 44 of FIG. 11, and thus may be advantageously used in the container 9 having a smaller volume than the holder 9, or in the aligner 43.

When performing automatic teaching, the control unit 47 recognizes (record or store) the target position (target point) by executing first, second and third steps mentioned below. In the first step, as shown in FIG. 11, the control unit 47 operates the drive system of the transfer mechanism 21 relating to the movement of the base 25 in the vertical-axis (z-axis) direction to find positions (i.e., the upper and lower end of the first detection target part 49) at which the detection signal (ON/OFF) of the first sensor is reversed, thereby to deduce the position of the center of the target member 44 (i.e., the position of the center of the first detection target part 49),with respect to the vertical direction based on the encoder values obtained at two signal-reversing positions. In the second step, the control unit 47 operates the drive system of the transfer mechanism 21 relating to the movement of the base 25 in a direction about the turning axis (.theta.-axis) to find positions (i.e., the left and right end of the first detection target part 49) at which the detection signal (ON/OFF) of the first sensor is reversed, thereby to deduce the position of the center of the target member 44 with respect to the turning direction (i.e., the position of the center of the first detection target part 49 with respect to right-and-left direction) based on the encoder values obtained at two signal-reversing positions. In the third step, as shown in FIG. 12, the control unit 47 operates the middle substrate support device 20a in the anteroposterior axis (x-axis) direction to find positions (i.e., the front and rear end of the second detection target part 50) at which the detection signal (ON/OFF) of the second sensor 40 is reversed, thereby to deduce the position of the center of the target member 44 with respect to the anteroposterior direction (i.e., the position of the center of the second detection target part 50 with respect to the anteroposterior direction) based on the encoder values obtained at two signal-reversing positions.

When performing the automatic teaching, preferably, the target members 44 are respectively placed at plural number of predetermined positions, for example, six positions (six points); and x-coordinate, z-coordinate and θ-coordinate of each point are determined. X-coordinate, z-coordinate and θ-coordinate of each of positions other than the above predetermined positions may be determined by suitably adding or subtracting a quotient, which is obtained by dividing "difference between coordinate values of two of the points at which the target members are placed" by "the number of wafers to be placed between the two points at which the target members are placed", to and from coordinate values of one of the predetermined positions.

Referring to FIG. 14, the operation of the transfer mechanism 21 for transferring a wafer W will be schematically described below. At first, the substrate support device 20 is inserted into the container such that the substrate support device 20 is positioned above a wafer W to be transferred. Then, the movable engagement member 31 of the gripping mechanism 28 disposed below the substrate support device 20 is moved toward the fixed engagement members 30 (i.e., closing the gripping mechanism 28) to grip the wafer W. With the wafer W being gripped, the substrate support device 20 is withdrawn from the container to remove the wafer W therefrom. Subsequently, the substrate support device 20 is then positioned above the ring-shaped support plate 15 in the holder 9 (FIG. 14(a)). Next, the movable engagement member 31 of the gripping mechanism 28 is moved away from the fixed engagement members 30 (i.e., opening the gripping mechanism 28) to release the wafer W from the gripping mechanism 28, so that the wafer W is placed on the ring-shaped support plate 15 (FIG. 14(b)). Thereafter, the substrate support device 20 is elevated and is withdrawn from the holder 9 (FIG. 14(c)).

The foregoing embodiment can provide the following advantageous effects. Since the transfer mechanism 21 is provided with plural (e.g., five) substrate support devices 20 (20a to 20e) each having a gripping mechanism 28 for gripping a wafer W on the under side thereof, plural (e.g., five) wafers W can be transferred at one time to the holder 9 having the ring-shaped support plates 15. Thus, the time required for transferring the wafers W can be significantly reduced. In addition, as the transfer mechanism has gripping mechanisms each configured to grip a process object on the under side of respective one of the substrate support devices, a large-sized spacing between adjacent substrate support devices 20 is not necessary. Thus, the arrangement pitch of the ring-shaped support plates 15 of the holder 9 can be reduced from about 16 mm (in the prior art) to about 11 mm. As a result, the number of wafers to be simultaneously heat-treated can be increased from about 50 to about 75 (1.5 times), resulting in improvement of throughput.

Further, the gripping mechanism 28 includes: the fixed engagement members 30 fixedly attached to the distal end portions of the substrate support device 20 to be engaged with the front edge of the wafer W; the movable engagement member 31 movably attached to the proximal end portion of the substrate support device 20 to be disengageably engaged with the rear edge of the wafer W; and the driving device 32 that moves the movable engagement member 31 anteroposteriorly. Thus, each wafer can readily be held on the under side of respective one of the substrate support devices 20 with simple structure. Moreover, the substrate support device 20 has the seats 34 and 35 that receive the front and rear peripheral portions of the wafer W such that a gap is formed between the lower surface of the substrate support device 20 and the upper surface of the wafer W. Therefore, when the wafer W is gripped from above, the upper surface of the wafer W can be prevented from being rubbed and damaged by the lower surface of the substrate support device 20. Further, since the cutouts 36 and 37 formed in the ring-shaped support plate 15 to prevent the ring-shaped support plate 15 from colliding with the fixed engagement members 30 and the movable engagement member 31, the gripping mechanism 28 can securely hold the wafer W from above without colliding with the ring-shaped support plate 15.

As described above, the vertical heat treatment system 1 according to the present invention includes: the heat treatment furnace 3; the holder 9 that is loaded and unloaded into and from the heat treatment furnace while the holder holds a plurality of wafers W which are arranged at multiple levels and spaced at vertical intervals; a transfer mechanism 21 that transfers wafers W between the holder 9 and a container 16 adapted to hold a plurality of wafers W at predetermined intervals, the transfer mechanism including a base 25 adapted for vertical movement and turning movement, and a plurality of substrate holding devices 20, each adapted to support a wafer W, mounted to the base 25 so as to be movable anteroposteriorly; a target member 44 to be placed at a target position, in the holder 9 or the container 16, to which a wafer W object is to be transferred; a first sensor 45, attached to the base 25, that emits a light beam such as laser beam directed toward a direction in which the substrate support devices 20 move, and detects the target member 44 upon receipt of a reflected light of the light beam; a second sensor 40, attached to two tip end portions of the substrate support device 20a, that detects the target member 44 upon interruption of a light beam traveling between the tip end portions by the target member 44; and a control unit 47 that deduces the target position based on detection signals of the first sensor 45 and the second sensor 40 and encoder values of drive systems of the transfer mechanism 21 associated with the detection signals, and recognizes the target position thus deduced. Due to the above arrangement, teaching of the target position of operation (i.e., target point) of the transfer mechanism can be performed automatically, and variations in teaching accuracy due to human errors can be prevented.

In addition, the target member 44 includes: a substrate part 48 having an dimension substantially identical with that of the wafer W; a first detection target part 49 provided on a center portion of the substrate part 48 to project therefrom, and having a circumference provided thereon with a reflective surface 49a for reflecting the light beam emitted by the first sensor; and one or two second detection target parts 50 to be detected by the second sensor, wherein the second detection target part 50 is provided on the upper portion of the first detection target part 49 if the second detection target numbers one, and the second detection target parts 50 are provided on the substrate part and arranged symmetrically with respect to the first detection target part 49 with the first detection target part 49 being disposed between the second detection target parts 50 if the second detection target numbers two. Thus, the teaching of the target position can readily be performed.

Furthermore, the control unit 47 is configured to perform the steps including: a first step that moves the base 25 in the vertical-axis (z-axis) direction to detect a position where the detection signal of the first sensor 45 is reversed, and deduces a center of the target member 44 with respect to a vertical direction based on an encoder value of the drive system relating to the vertical movement of the base 25 obtained at the signal-reversing position; a second step that moves the base about an vertical axis (or in the right-and-left direction) to detect a position where the detection signal of the first sensor 45 is reversed, and deduces a center of the target member 44 with respect to a turning direction based on encoder values of the drive system relating to the turning movement of the base 25 obtained at the signal-reversing position; and a third step that moves the substrate support device 20a to detect a position where the detection signal of the second sensor 40 is reversed, and deduces a center of the target member with respect to the anteroposterior direction based on encoder values of the drive system relating to the anteroposterior movement of the substrate support device obtained at the signal-reversing position, so that the control unit 47 recognizes the target position. Thus, the teaching of the target position can readily be performed automatically.

In addition, as the substrate support members 20 are respectively provided with the gripping mechanisms each adapted to hold a wafer W by gripping it from its frond and rear ends, the substrate support members 20 can securely hold wafers W. Therefore, the wafers W held by the substrate support members 20 could not be displaced, and thus the wafers W may be moved at a high speed and may be positioned accurately. Accordingly, the wafers W may be transferred at a higher transfer speed, as compared with the case where the wafers W are just placed on the substrate support members 20 in the prior art (Note that a high transfer speed may possibly result in falling of the wafers.). In addition, periodical correction of the position of a dummy wafer can be carried out rapidly. These advantages contribute to improvement of the throughput of the vertical heat treatment system 1. Moreover, the second sensor 40 is capable of not only detecting the target member 44 in the automatic teaching procedure, but also of detecting the conditions of wafers W before or after the treatment by vertically scanning the wafers W, which are held at multiple levels in the holder 9 unloaded from the reaction tube 5, along the direction in which the wafers W are arrayed. In this way, by monitoring the conditions of wafers W before or after the treatment, accidents such as damage of the wafers W can be prevented, and as a result, improvement of the credibility of the vertical heat treatment system 1 in operation can be achieved.

Although the present invention has been described in detail based on the preferred embodiment and example thereof with reference to the drawings, the present invention is not limited thereto, and various changes in design can be made without departing from the scope and sprit of the present invention. For example, although a ring boat having ring-shaped support plates is employed as a holder in the foregoing embodiment, the holder may be conventional one (which is called "ladder boat") without having ring-shaped support plates. In addition, although the transfer mechanism is configured to grip each wafer from above on the under side of respective one of the substrate support devices, the transfer mechanism may be configured to grip each wafer on the upper side of respective one of the substrate support devices by reversing the structure of each substrate support device upside down.

The invention claimed is:
1. A vertical heat treatment system comprising:
a heat treatment furnace;
a holder that is loaded and unloaded into and from the heat treatment furnace while the holder holds a plurality of process objects which are arranged at multiple level and spaced at vertical intervals;
a transfer mechanism that transfers process objects between the holder and a container adapted to hold a plurality of process objects at predetermined intervals, the transfer mechanism including a base adapted for vertical movement and turning movement, and a plurality of substrate holding devices, each adapted to support a process object, mounted to the base so as to be movable anteroposteriorly, wherein one of the plurality of substrate support devices is configured to move anteroposteriorly and independently from the other substrate support devices;

a first sensor, attached to the base, that emits a light beam directed toward a direction in which the substrate support device moves, and detects a target member upon receipt of a reflected light of the light beam;

a second sensor, attached to two tip end portions of said one of the substrate support devices, that detects the target member upon interruption of a light beam traveling between the tip end portions by the target member; and a control unit that deduces the target position based on detection signals of the first and second sensors and encoder values of drive systems of the transfer mechanism associated with the detection signals, and recognizes the target position thus deduced.

2. The vertical heat treatment system according to claim 1, wherein the target member includes:

a substrate part having an dimension substantially identical with that of the process object;

a first detection target part provided on a center portion of the substrate part to project therefrom, and having a circumference provided thereon with a reflective surface for reflecting the light beam emitted by the first sensor; and one or two second detection target parts to be detected by the second sensor, wherein the second detection target is provided on the upper portion of the first detection target part if the second detection target numbers one, and the second detection target parts are provided on the substrate part and arranged symmetrically with respect to the first detection target part with the first detection target part being disposed between the second detection target parts if the second detection target numbers two.

3. The vertical heat treatment system according to claim 1 or 2, wherein the control unit is configured to perform, when the control unit deduces and recognizes the target position, the steps including:

a first step that moves the base vertically to detect a position where the detection signal of the first sensor is reversed, and deduces a center of the target member with respect to a vertical direction based on an encoder value of the drive system relating to the vertical movement of the base obtained at the position where the detection signal of the first sensor is reversed;

a second step that turns the base about an vertical axis to detect a position where the detection signal of the first sensor is reversed, and deduces a center of the target member with respect to a turning direction based on an encoder value of the drive system relating to the turning movement of the base obtained at the position where the detection signal of the first sensor is reversed; and a third step that moves said one of the substrate support devices to detect a position where the detection signal of the second sensor is reversed, and deduces a center of the target member with respect to an anteroposterior direction based on an encoder value of the drive system relating to an anteroposterior movement of said one of the substrate support devices obtained at the position where the detection signal of the second sensor is reversed.

4. The vertical heat treatment system according to claim 1, wherein the substrate support devices are respectively provided with gripping mechanisms each adapted to hold a process object by gripping it from its front and rear ends.

5. The vertical heat treatment system according to claim 1, wherein the second sensor is arranged and adapted to detect conditions of process objects held in the holder at multiple levels by scanning the process objects along a vertical direction in which the process objects are arrayed.

6. A method of teaching a transfer mechanism of a vertical heat treatment system, which includes: a heat treatment furnace; a holder that is loaded and unloaded into and from the heat treatment furnace while the holder holds a plurality of process objects which are arranged at multiple level and spaced at vertical intervals; the transfer mechanism that transfers process objects between the holder and a container adapted to hold a plurality of process objects at predetermined intervals, the transfer mechanism including a base adapted for vertical movement and turning movement, and a plurality of substrate holding devices, each adapted to support a process object, mounted to the base so as to be movable anteroposteriorly, said method comprising the steps of:

placing a target member at a target position, in the holder or the container, to which a process object is to be transferred;

making one of the substrate support devices to be movable independently from the other substrate support devices;

providing, on the base, a first sensor that emits a light beam directed toward a direction in which the substrate support device moves, and detects the target member upon receipt of a reflected light of the light beam, and providing a second sensor, on two tip end portions of said one of the substrate support devices, that detects the target member upon interruption of a light beam traveling between the tip end portions by the target member;

recognizing the target position by performing: a first step that moves the base vertically to detect a position where the detection signal of the first sensor is reversed, and deduces a center of the target member with respect to a vertical direction based on an encoder value of the drive system relating to the vertical movement of the base obtained at the position where the detection signal of the first sensor is reversed; a second step that turns the base about an vertical axis to detect a position where the detection signal of the first sensor is reversed, and deduces a center of the target member with respect to a turning direction based on an encoder value of the drive system relating to the turning movement of the base obtained at the position where the detection signal of the first sensor is reversed; and a third step that moves the said one of the substrate support devices while it is placed anteriorly away from the other substrate support devices so as to detect a position where the detection signal of the second sensor is reversed, and deduces a center of the target member with respect to an anteroposterior direction based on an encoder value of the drive system relating to an anteroposterior movement of said one of the substrate support devices obtained at the position where the detection signal of the second sensor is reversed.

* * * * *